(12) United States Patent
Abdo et al.

(10) Patent No.: US 8,318,545 B2
(45) Date of Patent: Nov. 27, 2012

(54) METHOD OF MAKING A MOUNTED GALLIUM NITRIDE DEVICE

(75) Inventors: David F. Abdo, Scottsdale, AZ (US); Monte G. Miller, Phoenix, AZ (US); Lakshminarayan Viswanathan, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 245 days.

(21) Appl. No.: 12/695,983

(22) Filed: Jan. 28, 2010

(65) Prior Publication Data
US 2011/0180808 A1 Jul. 28, 2011

(51) Int. Cl.
*H01L 21/00* (2006.01)
(52) U.S. Cl. .................. 438/122; 438/46; 257/E31.023
(58) Field of Classification Search .................. 438/122, 438/25, 26, 46, 64, 93, 455; 257/E21.098, 257/E21.499, E31.023
See application file for complete search history.

(56) References Cited

U.S. PATENT DOCUMENTS

| 5,851,852 | A | 12/1998 | Ostop et al. |
| 6,479,325 | B2 * | 11/2002 | Ozawa ........................... 438/119 |
| 2004/0259279 | A1 * | 12/2004 | Erchak et al. ................... 438/22 |
| 2009/0095967 | A1 * | 4/2009 | Masui et al. .................... 257/98 |

* cited by examiner

*Primary Examiner* — Chuong A Luu
*Assistant Examiner* — Nga Doan
(74) *Attorney, Agent, or Firm* — James L. Clingan, Jr.

(57) ABSTRACT

A method of making a mounted gallium nitride (GaN) device includes obtaining a device structure comprising a silicon layer, a silicon carbide (SiC) layer over the silicon layer, and a GaN layer over the SiC layer. The GaN layer is processed to form an active layer of active devices and interconnect over the GaN layer. After the step of processing the GaN layer, a gold layer is formed on the silicon layer. The device structure is attached to a heat sink structure using the gold layer. The mounted GaN device includes the SiC layer over the polysilicon layer and the GaN layer over the SiC layer. The active layer is over the GaN layer.

14 Claims, 3 Drawing Sheets

METHOD OF MAKING A MOUNTED GALLIUM NITRIDE DEVICE

BACKGROUND

1. Field

This disclosure relates generally to methods of making semiconductor devices, and more specifically, to a method of making a mounted gallium nitride device.

2. Related Art

Increasingly, radio frequency devices need to be operated at higher frequencies and higher power levels. Typically, gallium nitride (GaN) is suitable for such applications. To manufacture GaN devices, gallium nitride is generally grown on silicon carbide (SiC) substrates. Growing gallium nitride on a SiC substrate poses problems in packaging the GaN devices. This is because traditionally SiC substrate based devices have been packaged by bonding the SiC substrate based devices with heat sinks using metallic preforms, such as gold-tin (Au—Sn) preforms. Such preforms when used with GaN devices complicate the process flow and cost of mounting GaN devices on a substrate, such as a heat sink.

Accordingly, there is a need for a more efficient method of making a mounted gallium nitride device.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a method of making a mounted gallium nitride (GaN) device is provided. The method includes obtaining a device structure comprising a silicon layer, a silicon carbide (SiC) layer over the silicon layer, and a GaN layer over the SiC layer. The method further includes processing the GaN layer to form an active layer of active devices and interconnect over the GaN layer. The method further includes after the step of processing the GaN layer, forming a gold layer on the silicon layer. The method further includes attaching the device structure to a heat sink structure using the gold layer.

In another aspect, a mounted gallium nitride (GaN) device is provided. The mounted GaN device includes a silicon layer and a silicon carbide (SiC) layer over the silicon layer. The mounted GaN device further includes: (1) a GaN layer over the SiC layer, (2) an active layer of active devices and interconnect over the GaN layer, and (3) a heat sink. The mounted GaN device further includes a gold/silicon eutectic bond between the heat sink and the silicon layer.

In yet another aspect, a method of making a mounted gallium nitride (GaN) device is provided. The method includes obtaining a device structure comprising a silicon layer, a silicon carbide (SiC) layer over the silicon layer, and a GaN layer over the SiC layer. The method further includes processing the GaN layer to form an active layer of active devices and interconnect over the GaN layer. The method further includes attaching the silicon layer to a heat sink structure with a gold/silicon eutectic bond.

Figure 1:
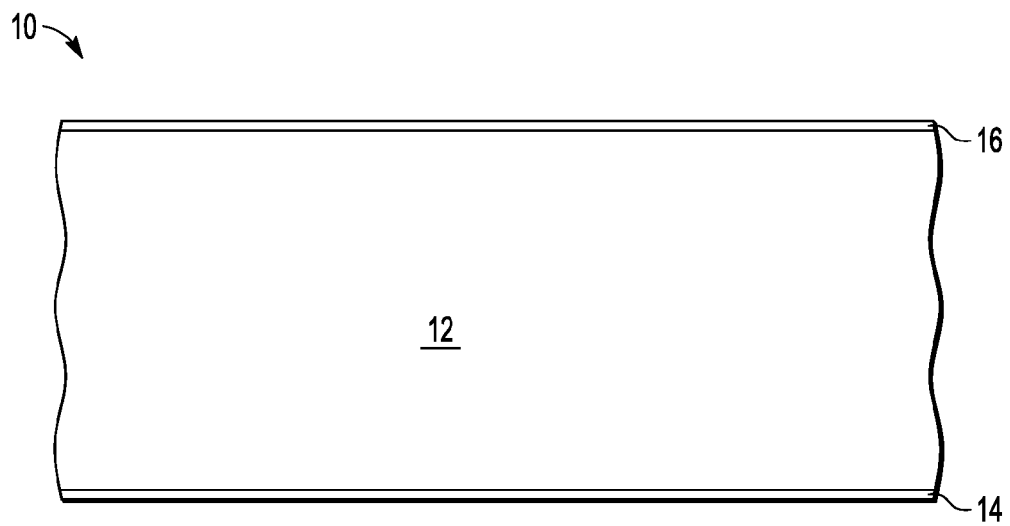
FIGS. 1-5 show cross-section views of a semiconductor device during different processing stages.

FIG. 1 shows a cross-section view of a semiconductor device 10 during a processing stage. By way of example, semiconductor device 10 may include a wafer comprising several layers, including silicon carbide (SiC) substrate layer 12. On a bottom surface of the SiC substrate layer 12, semiconductor device 10 may further include a silicon layer 14. On a top surface of the SiC substrate layer 12, semiconductor device 10 may further include a gallium nitride (GaN) layer 16. SiC substrate layer 12 may be any of the various crystalline forms of SiC. Silicon layer 14 may be mono-crystalline or a poly-crystalline layer, such as polysilicon. Silicon layer 14 may be amorphous. As used herein, the term bottom surface of the SiC substrate layer 12 refers to the surface that is on the side that will be bonded to a heat sink later and the term top surface of the SiC substrate layer 12 refers to the surface that is on the other side. The term top surface further refers to the surface that is on the side that will have active devices formed therein. Although FIG. 1 shows specific layers arranged in a specific manner, semiconductor device 10 may include fewer or more layers arranged differently. For example, a buffer layer (not shown) may be added between SiC substrate layer 12 and GaN layer 16. In another embodiment, however, SiC substrate layer 12 may be sandwiched between silicon layer 14 and GaN layer 16, such that there is not an intervening layer between SiC substrate layer 12 and any of silicon layer 14 and GaN layer 16. In one embodiment, SiC substrate layer 12 may be at least 25 times thicker than silicon layer 14. In one embodiment, SiC substrate layer 12 may be at least 100 times thicker than GaN layer 16. By way of example, SiC substrate layer 12 may be 75-400 microns in thickness; silicon layer 14 may be 0.5-10 microns in thickness; and GaN layer 16 may be 0.5-3 microns.

Figure 2:
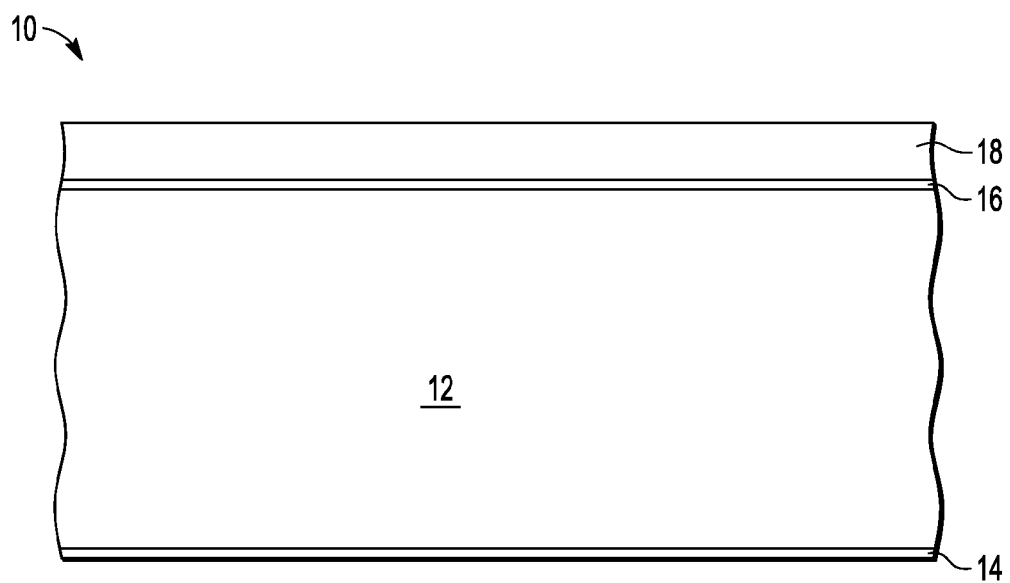

Next, as shown in FIG. 2, by processing GaN layer 16, an active layer 18 having various active devices and interconnects may be formed over GaN layer 16. This layer may be formed using various semiconductor fabricating steps, such as masking and etching.

Figure 3:
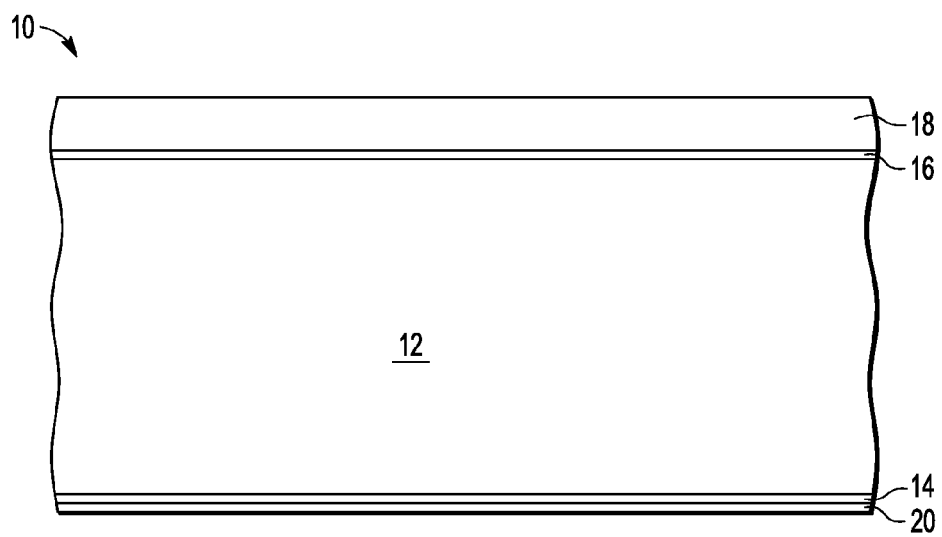

Next, as shown in FIG. 3, a gold (Au) layer 20 may be formed on a non-active side (the side that does not have active layer 16) of semiconductor device 10. As part of this step a layer of gold ranging in thickness from 6000-20000 Angstroms may be deposited. In another embodiment, the layer of gold may range in thickness from 10,000-12,000 Angstroms. In one embodiment, gold layer 20 may be formed by sputtering gold on the non-active side of semiconductor device 10. After this step, the wafer comprising these various layers may be sawed into separate die. The next steps described below refer to the processing of singulated die.

Figure 4:
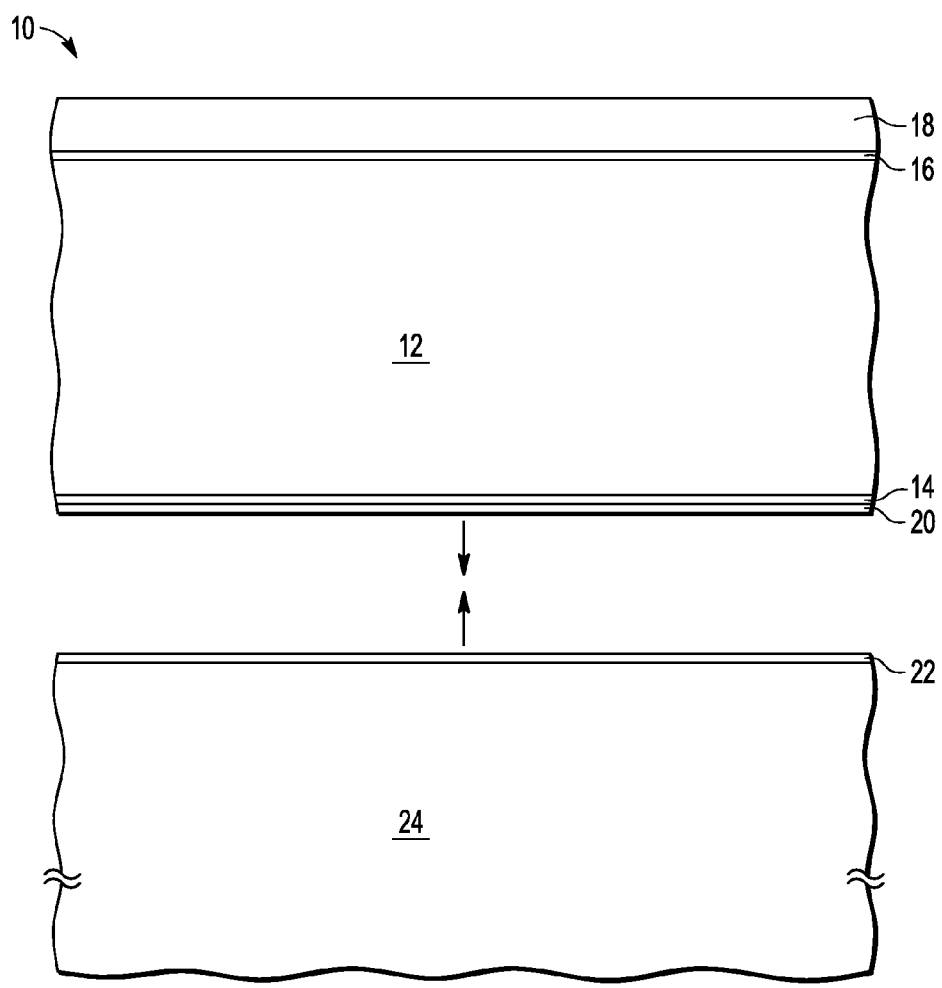
Figure 5:
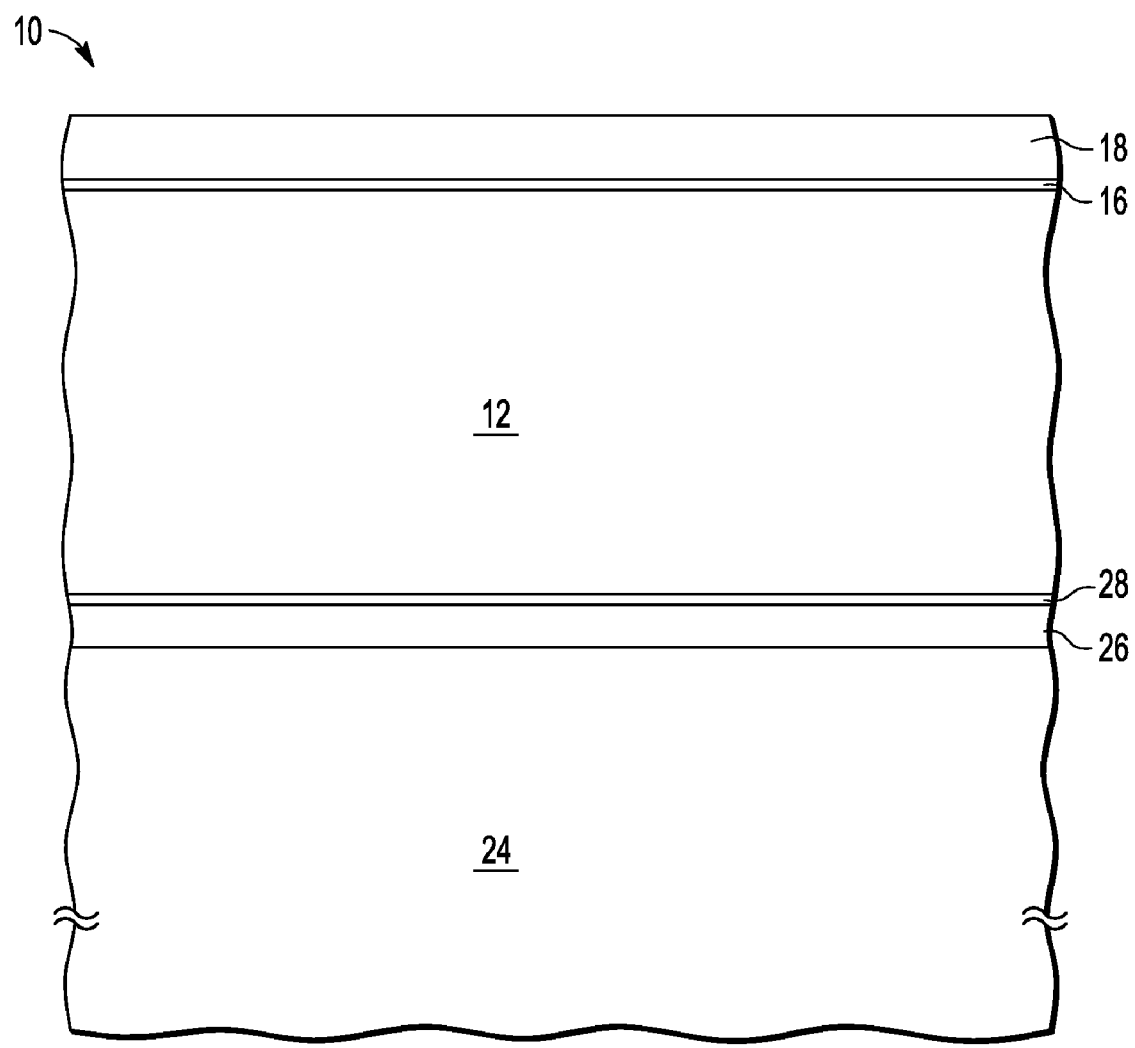

Next, as shown in FIG. 4, a heat sink 24 having a gold layer 22, which may be plated on it, may be brought in contact with SiC substrate layer 12 having gold layer 20. The two may be pressed together and subjected to heat. Other forms of mechanical and thermal energy may also be used. For example, scrubbing may also be used. In one embodiment, this process may be performed by joining SiC substrate layer 12 and heat sink 24 at a temperature that is preferably between 385 to 430 degrees Celsius but could be at other temperatures such as between 370 degrees Celsius and 450 degrees Celsius. A force of about 30 gram force may be applied between SiC substrate layer 12 and heat sink 24. This is applied for about one minute. Other forces and time may be used instead. As part of this process, SiC substrate layer 12 and heat sink 24 are subjected to scrubbing, as well. The scrubbing may be performed with an amplitude of about 10 microns at a frequency of about 100 hertz. As shown with reference to FIG. 5, the pressing, heating, and scrubbing of the die with heat sink 24 will result in heat sink 24 getting attached to the singulated die resulting in a packaged gallium nitride device. By way of example, the pressing and heating will result in the formation of a gold/silicon (Au—Si) eutectic layer 26. In some instances, all of the silicon from silicon layer 14 may not become part of the gold/silicon (Au—Si) eutectic layer 26, and instead there may be remainder silicon layer 28. Heat sink 24 may act as both as a thermally conductive and an electrically conductive frame for semiconductor device 10.

By now it should be appreciated that there has been provided methods of making a mounted gallium nitride device. Because the apparatus implementing the present invention is, for the most part, composed of electronic components and materials known to those skilled in the art, details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Thus, for example, "obtaining," as used herein includes making, as well. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a mounted gallium nitride (GaN), comprising:
    obtaining a device structure in a wafer, the device structure comprising a silicon layer, a silicon carbide (SiC) layer over the silicon layer, and a GaN layer over the SiC layer;
    processing the GaN layer to form an active layer of active devices and interconnect over the GaN layer;
    after the step of processing the GaN layer, forming a gold layer on the silicon layer;
    after forming the gold layer, sawing the wafer so that the device structure is a singulated die from the wafer; and
    attaching the device structure to a heat sink structure using the gold layer.

2. The method of claim 1, wherein the step of attaching is further characterized as forming a eutectic bond.

3. The method of claim 1, wherein the step of attaching is further characterized by the heat sink structure further characterized as having at least a layer of gold.

4. The method of claim 3, wherein the step of attaching is further characterized by outer layer of gold being eutectically bonded to the gold layer and a portion of the silicon layer is consumed into a gold/silicon eutectic bond.

5. The method of claim 1, wherein the step of obtaining the device structure is further characterized by the SiC layer functioning as a substrate.

6. The method of claim 5, wherein the step of obtaining the device structure is further characterized by the SiC layer being at least a 25 times thicker than the silicon layer.

7. The method of claim 6, wherein the step of obtaining the device structure is further characterized by the SiC layer being at least a hundred times thicker than the GaN layer.

8. The method of claim 7 wherein the step of attaching comprises applying at least one of mechanical energy and thermal energy.

9. The method of claim 8, wherein the step of obtaining the device structure is further characterized by the silicon layer comprising polysilicon.

10. The method of claim 1, wherein the step of attaching is further characterized as forming a gold/silicon eutectic bond by scrubbing and applying heat and pressure between the gold layer and a layer of gold on the heat sink structure.

11. A method of making a mounted gallium nitride (GaN) device, comprising:
    obtaining a device structure in a wafer, the device structure comprising a silicon layer, a silicon carbide (SiC) layer over the silicon layer, and a GaN layer over the SiC layer;
    processing the GaN layer to form an active layer of active devices and interconnect over the GaN layer;
    after forming the active layer, sawing the wafer so that the device structure is a singulated die from the wafer; and
    after sawing the wafer, attaching the silicon layer of the device structure to a heat sink structure with a eutectic bond comprising gold and silicon.

12. The method of claim 11, wherein the step of obtaining is further characterized by the SiC layer being at least 100 times thicker than the GaN layer.

13. The method of claim 11, wherein the step of obtaining is further characterized by the SiC layer being at least 25 times thicker than the silicon layer.

14. The method of claim 11, wherein the step of obtaining is further characterized by the silicon layer being polysilicon.

* * * * *